(12) United States Patent
Lindsey, Jr. et al.

(10) Patent No.: US 8,220,685 B1
(45) Date of Patent: Jul. 17, 2012

(54) SYSTEM FOR BREAKING A SEMICONDUCTOR WAFER OR OTHER WORKPIECE ALONG A SCRIBE LINE

(75) Inventors: Paul C. Lindsey, Jr., Lafayette, CA (US); Christopher K. Lindsey, Lafayette, CA (US); Jeffery D. Atkinson, Sebastopol, CA (US)

(73) Assignee: Micro Processing Technology, Inc., Lafayette, CA (US)

( * ) Notice: Subject to any disclaimer, the term of this patent is extended or adjusted under 35 U.S.C. 154(b) by 1095 days.

(21) Appl. No.: 11/222,292

(22) Filed: Sep. 8, 2005

(51) Int. Cl.
*B26F 3/00* (2006.01)
(52) U.S. Cl. .................. 225/93; 225/97; 83/23; 83/100
(58) Field of Classification Search .............. 225/1, 2, 225/96.5, 97, 93; 83/22–24, 27, 78, 100, 83/167, 177
See application file for complete search history.

(56) References Cited

U.S. PATENT DOCUMENTS

| | | | |
|---|---|---|---|
| 3,687,345 A | | 8/1972 | Carlson et al. |
| 3,790,051 A | | 2/1974 | Moore |
| 4,068,788 A | | 1/1978 | Gubitose et al. |
| 4,140,258 A | * | 2/1979 | Gray .................. 225/2 |
| 4,653,680 A | | 3/1987 | Regan |
| 5,069,195 A | * | 12/1991 | Barozzi .............. 125/23.01 |
| 5,269,643 A | * | 12/1993 | Kodama et al. .......... 414/416.02 |
| 5,297,710 A | * | 3/1994 | Juras ................... 225/2 |
| 5,428,269 A | | 6/1995 | Hedrick |
| 5,535,997 A | * | 7/1996 | Croyle et al. ............ 271/12 |
| 5,785,225 A | | 7/1998 | Loomis |
| 5,820,006 A | | 10/1998 | Turner |
| 6,826,840 B1 | * | 12/2004 | Lindsey et al. ............ 33/18.1 |
| 2004/0050894 A1 | * | 3/2004 | Andrewlavage, Jr. ........ 225/1 |

* cited by examiner

*Primary Examiner* — Phong Nguyen
(74) *Attorney, Agent, or Firm* — Thomas R. Lampe

(57) ABSTRACT

Apparatus and method for breaking a scribed semiconductor wafer utilizes two vacuum chucks, at least one of the vacuum chucks pivotable about a pivot line. The scribe line is aligned with the pivot line and relative movement between the vacuum chucks causes bending forces to be applied to the wafer and breakage of the wafer along the scribe line.

13 Claims, 4 Drawing Sheets

SYSTEM FOR BREAKING A SEMICONDUCTOR WAFER OR OTHER WORKPIECE ALONG A SCRIBE LINE

TECHNICAL FIELD

This invention has application to the manufacture of semiconductor devices and circuits and other products wherein a scribed workpiece is broken along a scribe line.

BACKGROUND OF THE INVENTION

One of the methods of separating semiconductor wafers into individual devices or die is to scribe the wafer using a sharp object, usually a diamond tip, and then break or cleave the wafer along the scribed lines. A number of devices have been designed to carry out this breaking or cleaving process.

U.S. Pat. No. 3,687,345 describes a device to move the wafer so that the scribed line on the wafer surface is over a "breaking ridge" formed in a solid block of material. An air-powered diaphragm presses down on the top surface of the wafer. This forces the wafer down onto the "breaking ridge" which produces the bending moment required to break the wafer along the scribed line.

A device is disclosed in U.S. Pat. No. 3,790,051 wherein a wafer is placed upside down on a pliant material. A roller is pressed into the back of the wafer and as it is moved across the wafer, providing the bending force necessary to break the wafer into individual die.

In the apparatus described in U.S. Pat. No. 4,068,788, the scribe line on the surface of a wafer is aligned over the edge of a step with one row of die extending beyond the step. A shear beam is then applied to the extreme edge of the extended die providing the bending motion required to break the row of die.

U.S. Pat. Nos. 5,428,269 and 5,785,225 describe an apparatus that breaks the wafer by aligning the scribed line over a step or a blade and then rolling a wheel along the top side of the wafer to provide the bending force required to break the wafer.

The problem with all of the above-described approaches, is that some portion of the apparatus comes in contact with the top side of the wafer. There are frequently fragile structures essential to the operation of the device located at the top side of the wafer that can be damaged by contact with the apparatus.

U.S. Pat. No. 4,653,680 describes an apparatus that breaks the semiconductor wafer without, in most cases, contacting the top side of the wafer. In the apparatus a breaker arm having a knife-edge is driven into the back side of the wafer under the scribe line. In some cases, it was found necessary to place an anvil over the wafer to limit the upward travel of the wafer when it is struck by the breaker arm.

U.S. Pat. No. 5,820,006 utilizes the same general approach as that disclosed in U.S. Pat. No. 4,653,680 but discloses the use of vacuum chucks on either side of the breaking arm to prevent excessive upward movement of the wafer when it is struck by the breaking arm. While this technique allows wafer breaking without contacting the top surface of the wafer, the impact of the blade on the back of the wafer causes a very rough breaking action that results in chips being broken out along the sides of the scribe lines, and in many cases, causing damage to the device.

DISCLOSURE OF INVENTION

The apparatus and method of the present invention break semiconductor wafers and similar hard brittle substrates after they have been scribed using a sharp object, such as a diamond tip, without a portion of the apparatus contacting the top of the wafer surface and without excessive chipping and damage along the scribed line to separate the workpiece into first and second workpiece portions.

The apparatus includes a first vacuum chuck having a first workpiece support surface for supporting the workpiece first portion.

The apparatus further includes a second vacuum chuck adjacent to the first vacuum chuck and having a second workpiece support surface for supporting the workpiece second portion.

Vacuum chuck mover structure causes movement of at least one of the first and second vacuum chucks to exert bending forces on the workpiece supported thereby to break the workpiece along the scribe line formed therein.

Hinge structure hingedly connects the first vacuum chuck and the second vacuum chuck along a hinge line disposed adjacent to and in substantial alignment with the scribe line. Bending forces are applied to the workpiece by employing the vacuum chuck mover structure to cause relative pivotal movement between the first and second vacuum chucks about the hinge line.

The method of the invention is for breaking a scribed semiconductor wafer or other scribed workpiece along a scribe line formed in the workpiece break the workpiece into first and second workpiece portions.

The method includes the step of positioning the first workpiece portion adjacent to a first workpiece support surface of a first vacuum chuck.

Substantially simultaneously, the second workpiece portion is positioned adjacent to a second workpiece support surface of second vacuum chuck.

Vacuum is applied at the first vacuum chuck and at the second vacuum chuck to prevent slidable movement of the workpiece.

During the vacuum application step, relative movement is caused between the first vacuum chuck and the second vacuum chuck to exert bending forces on the workpiece to break the workpiece along the scribe line.

The step of causing relative movement between the first vacuum chuck and the second vacuum chuck comprises causing relative pivotal movement between the first vacuum chuck and the second vacuum chuck along a hinge line between the first vacuum chuck and the second vacuum chuck, the hinge line being adjacent to and disposed in alignment with the scribe line.

Other features, advantages and objects of the present invention will become apparent with reference to the following description and accompanying drawings.

BEST MODE FOR CARRYING OUT THE INVENTION

Figure 1:
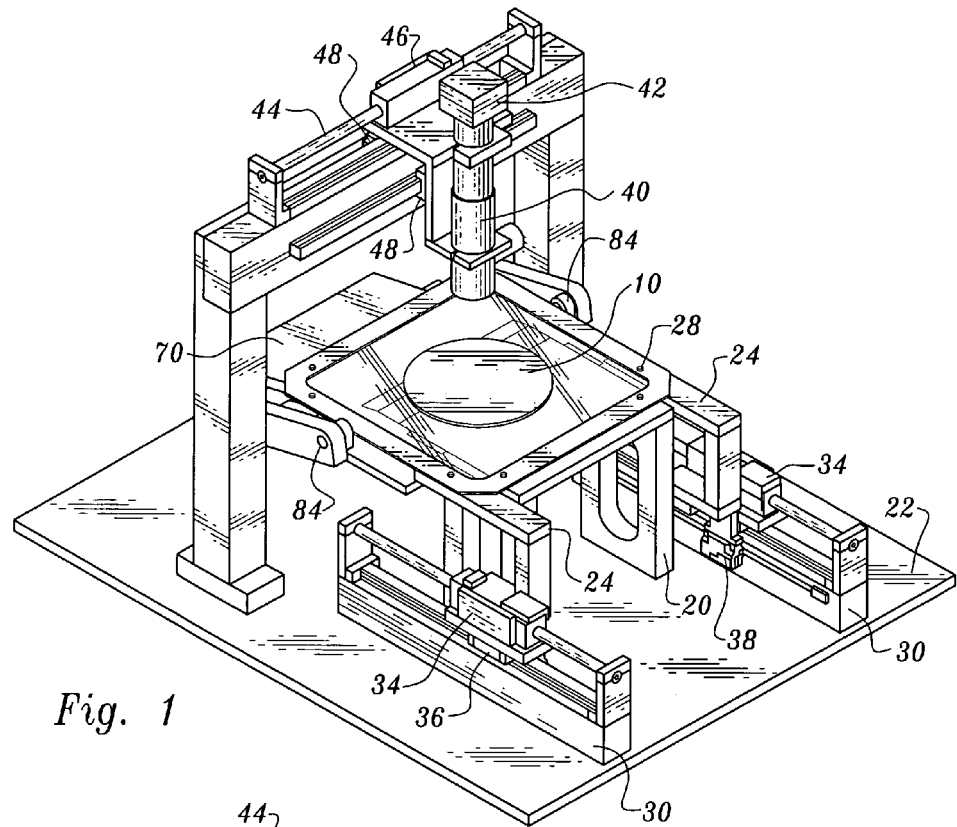
FIG. 1 is a frontal, perspective view of apparatus constructed in accordance with the teachings of the present invention and a workpiece in the form of a semiconductor wafer positioned over vacuum chucks of the apparatus.
Figure 2:
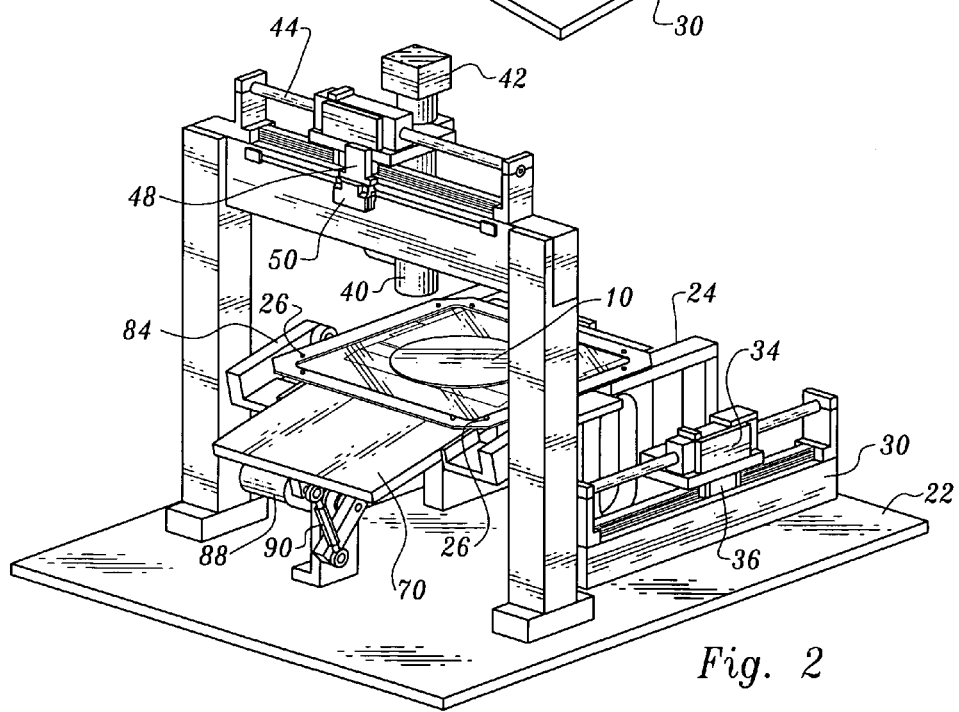
FIG. 2 is a rear, perspective view of the apparatus and wafer.
Figure 3:
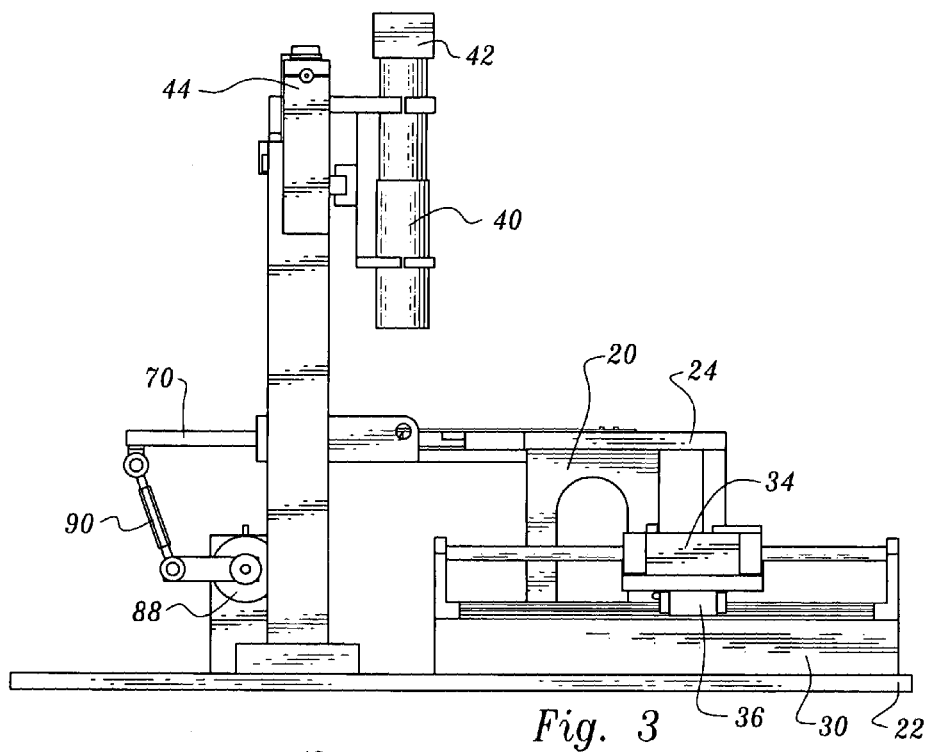
FIG. 3 is a side, elevational view of the apparatus prior to breaking of the wafer.
Figure 4:
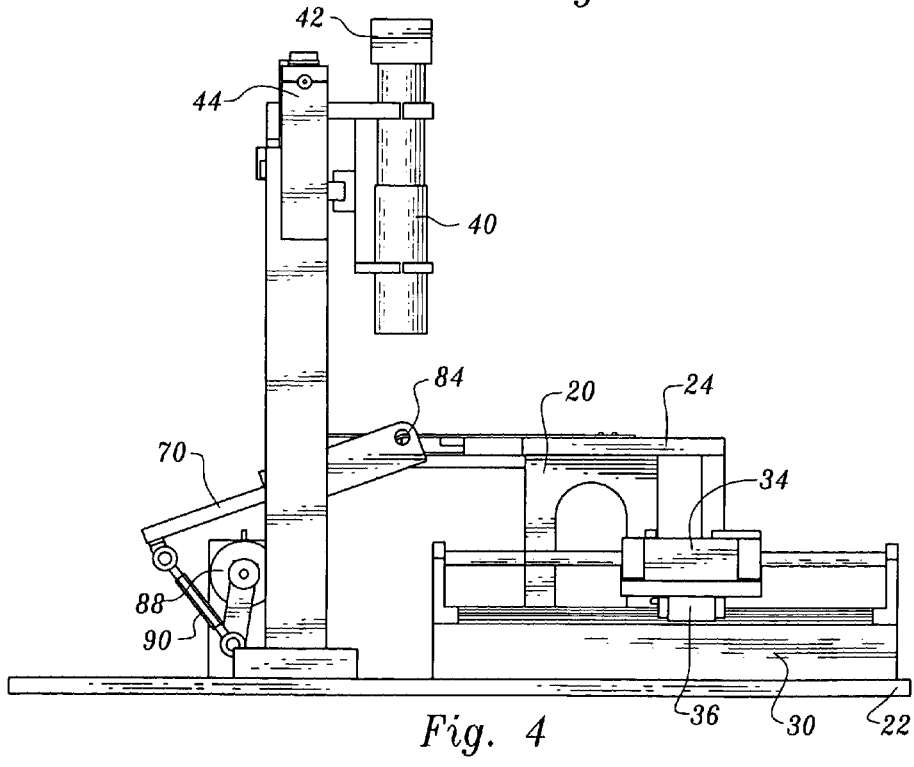
FIG. 4 is a side, elevational view of the apparatus and wafer after breaking along a scribe line has taken place.
Figure 5:
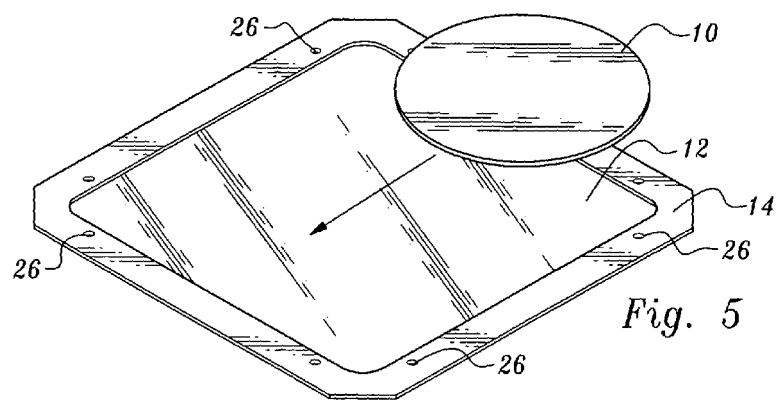
FIG. 5 illustrates an unscribed semiconductor wafer being positioned on a plastic film support stretched over a frame.

Before a semiconductor wafer is diced using a scribe-and-break process, it is standard practice to mount the wafer on a sheet of plastic film. FIG. 5 shows a semiconductor wafer 10 in unscribed condition being placed on a sheet 12 of plastic film stretched tightly on a wafer-mounting frame 14. The plastic film has adhesive on the under side thereof used to hold the wafer and the individual die in place during both the scribing process and subsequent breaking process disclosed and claimed herein.

The wafer may be scribed in any suitable manner, employing for example a sharp object, such as a diamond tip, as disclosed in U.S. Pat. No. 6,826,840. The result of this scribing process is a first series of scribe lines parallel to each other and another series of scribe lines parallel to each other and perpendicular to the first series of scribe lines. These two series of scribe lines define the edges of all the die on the wafer along which the breaks will occur.

Figure 6:
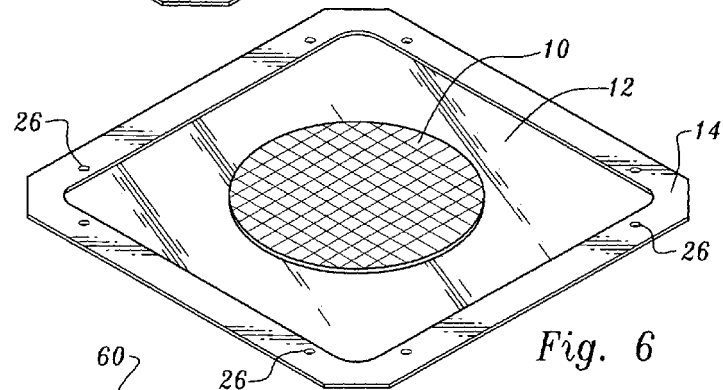
FIG. 6 illustrates the wafer having been scribed while positioned on the plastic film within the frame.
Figure 8:
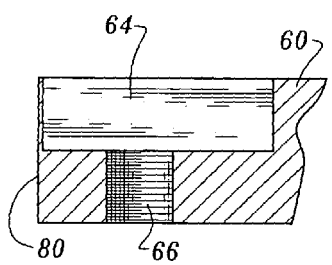
FIG. 8 is an enlarged, cross-sectional view taken along the line 8-8 in FIG. 7.
Figure 7:
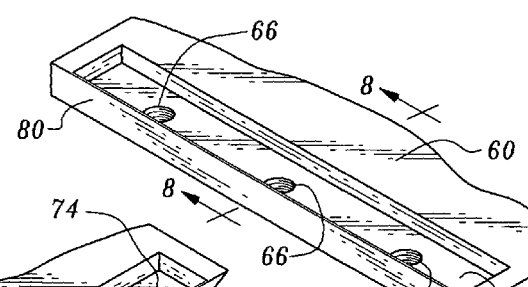
FIG. 7 is a perspective view of an end portion of a chuck plate of one of the two vacuum chucks employed in the apparatus.
Figure 9:
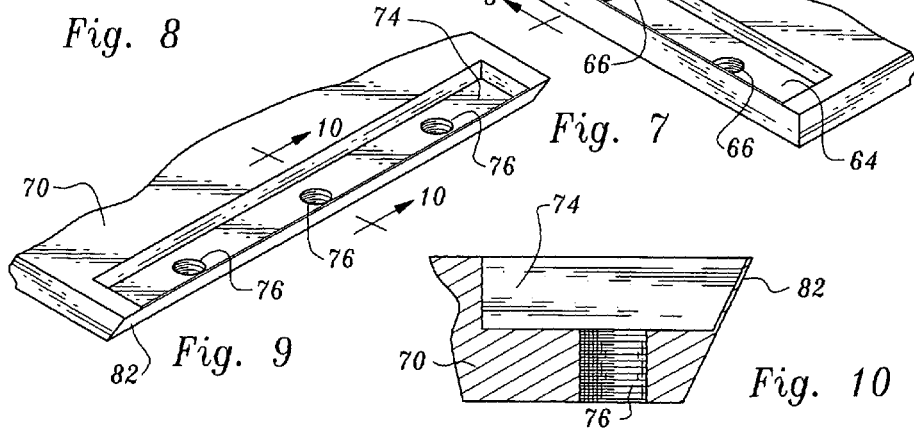
FIG. 9 is a perspective view of an end portion of a chuck plate of the other of the two vacuum chucks employed in the apparatus.
Figure 10:
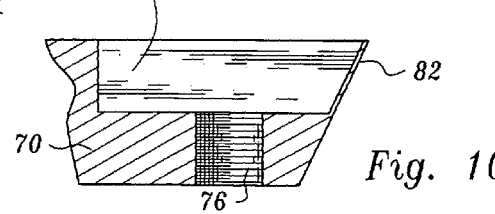
FIG. 10 is an enlarged, cross-sectional view taken along line 10-10 in FIG. 9.

FIG. 6 shows the wafer 10 after it has gone through the scribing process, the wafer still being retained by adhesive on the plastic film sheet 12. Now the wafer is in condition for breaking along the scribe lines thereof to form a plurality of die.

As will be seen below, the apparatus and method of the present invention require no contact with the top or outer surface of the wafer. In addition, because the breaking motion is smooth and precise, chipping and other damage along the scribe lines are minimized.

Referring now also to FIGS. 1-4 and 7-13, the complete breaker apparatus constructed in accordance with the teachings of the present invention is illustrated. The breaker frame, stretched plastic film, and scribed wafer 10 are shown in position for breaking to occur, the scribe lines not being shown in FIGS. 1 and 2 in the interest in simplicity, but being shown in FIGS. 11-13 and designated by reference numeral 16. The apparatus includes a framework 20 including a base 22. The mounting frame 14 is positioned on a pair of frame movement arms 24, the frame having holes 26 which receive alignment pins 28 extending upwardly from the frame movement arms. The mounting frame may be held in place using magnets or vacuum (not shown).

The apparatus incorporates two frame movement stages 30 disposed above the base 22 to which the frame movement arms are connected. The frame movement stages are utilized to both rotatably position the frame and supported wafer by moving independently or linearly position the frame and wafer by moving together.

Each frame movement stage includes a linear motor 34, a linear bearing 36 and a linear encoder 38.

A microscope 40 and a camera 42 are mounted on a scribe line alignment stage 44 of the apparatus. The scribe line alignment stage includes a linear motor 46, two linear bearings 48 and a linear encoder 50.

Fixedly attached to chuck plate brackets 52 of framework 20 and supported thereby in an elevated position over base 22 is a vacuum chuck plate 60 of a fixed vacuum chuck. Another component of the fixed vacuum chuck is a porous vacuum chuck insert 62 formed for example from a porous ceramic material such as aluminum oxide or silicon carbide. The insert is positioned in an elongated cavity 64 formed at an end of the vacuum chuck plate 60. Openings 66 in the vacuum chuck plate 60 provide communication between the porous chuck insert 62 and a suitable vacuum source (not shown).

The apparatus also includes another vacuum chuck, this including a vacuum chuck plate 70 having a porous chuck insert 72 positioned in a cavity 74 thereof. Openings 76 in vacuum chuck plate 70 provide communication between the porous chuck insert 72 and a source of vacuum (not shown).

The porous chuck inserts 62, 72 of the above-described vacuum chucks are very close to the edges of adjacent ends and facing walls 80, 82 of the chucks to provide vacuum for holding the wafer 10 on the chucks in very close proximity to the scribe line where a break is to be made. After machining cavities 64, 74 in the metal vacuum chuck plates, pieces of porous ceramic comprising the inserts 62, 72 are fit into the cavities and affixed in place through use of epoxy for example.

The top surfaces of the vacuum chucks are preferably made flat and planar, using for example a precision grinder. In accordance with the teachings of the present invention, the end facing walls 80, 82 of the vacuum chuck plates 60 are also ground using a precision grinder until only a very small thickness of metal remains on the vacuum chuck plates alongside the porous chuck inserts. It is to be noted that the facing side wall 80 of the vacuum chuck plate 60 of the fixed vacuum chuck extends downwardly from the workpiece support surface thereof and is substantially orthogonal thereto. In contrast, the facing side wall 82 defines an acute angle with the workpiece support surface of the vacuum chuck comprised of vacuum chuck plate 70 and porous chuck insert 72.

The facing side walls 80, 82 diverge away from one another in a downward direction. The two vacuum chucks are held together by hinges 84 which have their pivot point precisely centered on the ends of the line (pivot line) at which the top edges of the two vacuum chucks meet.

Figure 11:
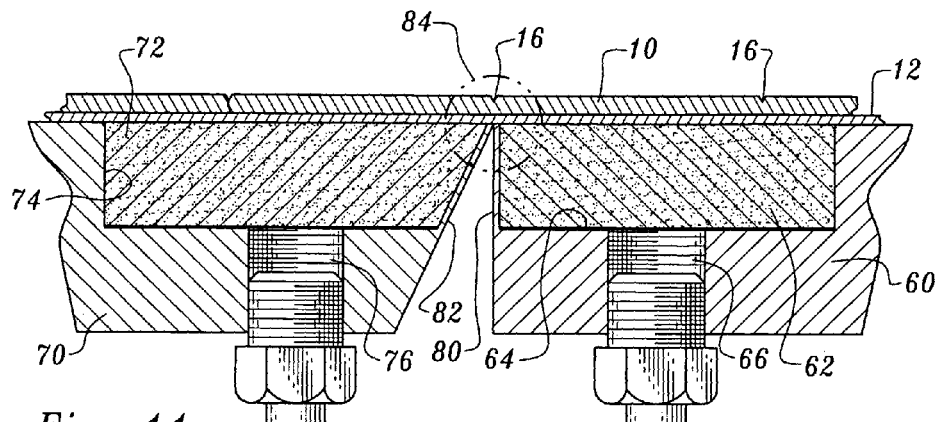
FIG. 11 is an enlarged, side, elevational, cross-sectional view illustrating end portions of the two vacuum chucks with the upper workpiece support surfaces thereof lying along a common plane and supporting the wafer in flat condition prior to forming a break therein along a scribe line.
Figure 13:
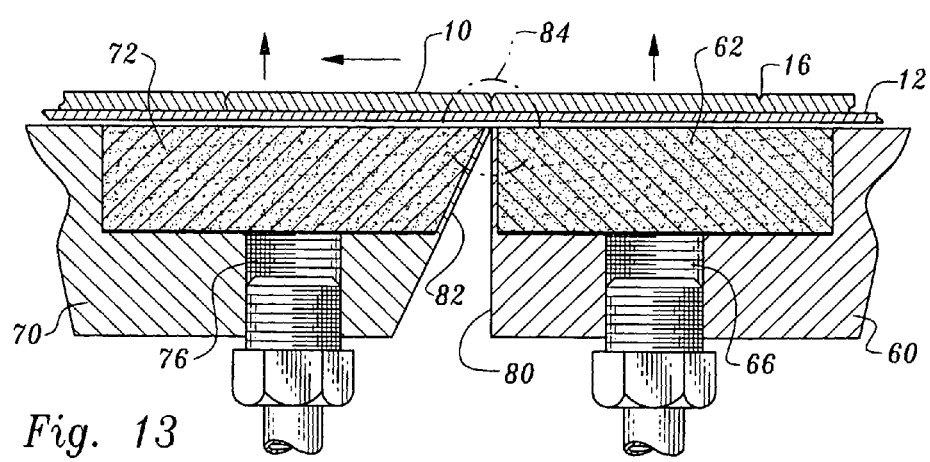
FIG. 13 shows the vacuum chucks returned to the relative positions shown in FIG. 11 after formation of the scribe line break and the wafer transported to position another scribe line along the pivot line of the vacuum chucks.

FIGS. 11 and 13 show the normal positions assumed by the vacuum chucks when they are not causing breaking of the wafer but instead supporting it in a flat condition, the top support surfaces thereof being co-planar.

Figure 12:
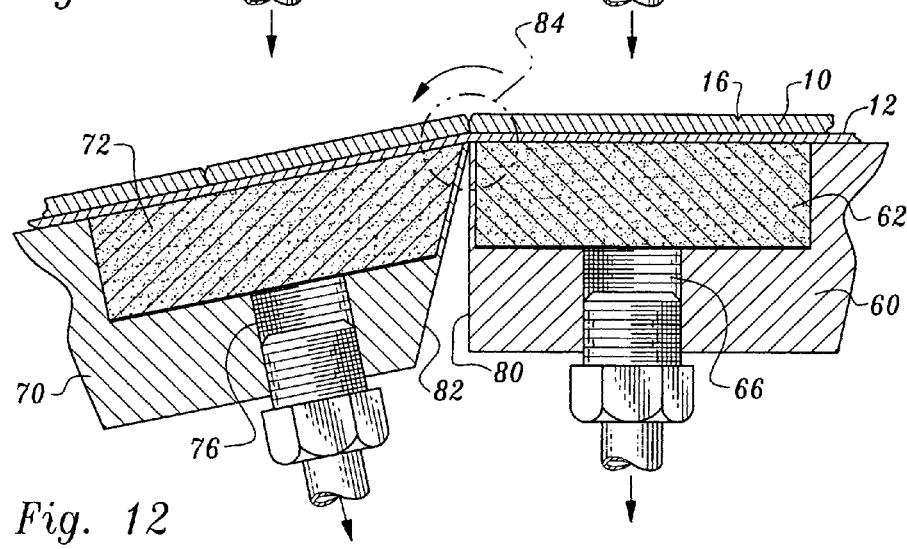
FIG. 12 is a view similar to FIG. 11, but illustrating the vacuum chucks having been relatively pivoted to exert bending forces on the wafer to create a break along the scribe line.

FIG. 12 shows the vacuum chuck comprised of vacuum chuck plate 70 and porous chuck insert 72 pivoted to break the wafer, the workpiece support surfaces of the vacuum chucks forming an obtuse angle. Pivoting is caused by a motor 88 interconnected to vacuum chuck plate 70 by a linkage 90.

Operation of the apparatus is as follows: The scribed wafer 10 (mounted on the plastic film sheet 12 stretched tightly on the mounting frame 14) is placed on the frame movement arms 24 with the mounting frame holes receiving the alignment pins of the frame movement arms.

The vacuum chuck plate 70 is in a position wherein the upper surface thereof is disposed in the same plane as the upper surface of vacuum chuck plate 60 of the fixed vacuum chuck.

The frame movement stages 30 can be operated independently and moved to allow a scribed line on the wafer to be rotationally aligned with the pivot line where the top edges of the two vacuum chucks meet. The microscope 40 and the camera 42 can be scanned across the wafer using the scribe line alignment stage 44 to ensure that the rotational alignment is correct across the entire length of the scribe line.

Next the frame movement stages 30 operate together to move the frame movement arms 24 and linearly align the scribe line with the pivot line where the top edges of the two vacuum chucks meet. A vacuum is applied to the two vacuum chucks, holding the film and wafer firmly in place.

The motor 88 is activated and the pivotally movable vacuum chuck plate 70 is moved to an angle chosen to break the wafer along the aligned scribe line. This is shown in FIG. 12.

The motor 88 through the mechanical linkage 90 returns the vacuum chuck plate 70 to its position shown in FIG. 13. The vacuum to the vacuum chucks is turned off.

The two frame movement stages 30, moving together, move the frame 14, plastic film sheet 12 and wafer 10 a distance equal to the spacing between the scribe lines, and the break sequence is repeated. This process continues until all of the scribe lines in this direction are broken. The frame movement stages are then returned to their starting positions, the mounting frame is removed, rotated ninety degrees, and placed back on the frame alignment arms. The break process is repeated as described above until all the scribe lines in the second direction are broken.

In a production system, the positioning of the wafer relative to the vacuum chucks could be determined using a machine vision program and a motion control program which directly controls movement of the stages. An additional program could control system sequencing and error handling. All of the programs would run on a computer attached to the mechanical portion of the system.

In tests involving the disclosed apparatus, edges of the two vacuum chuck plates were ground back to approximately 125 microns from the edges of the vacuum chucks. This allowed breakage of die with dimensions down to 300 microns by 300 microns. It is believed that additional grinding with a consequent reduction of the thickness of the vacuum chuck plates at the facing sides of the vacuum chucks would allow effective breaking of dies with dimensions down to about 150 microns by 150 microns.

It has been found that breaking 0.004 inch thick gallium arsenide and indium phosphide wafers requires the movable vacuum chuck plate be moved to an angle of 1 to 3 degrees from the horizontal during the breaking process. Breaking 0.010 inch thick silicon wafers requires an angle of 4 to 6 degrees and breaking 0.010 inch thick glass wafers requires an angle of 6 to 8 degrees.

Because the breaking process of this invention is smooth and precise and there is no contact with the top surface of the wafer, the breaks along the scribe lines are clean. There is minimal chipping along the edges of the scribe lines and no damage to the devices.

The invention claimed is:

1. Apparatus for breaking a scribed semiconductor wafer or other scribed workpiece having a top workpiece surface and a planar bottom workpiece surface along a scribe line formed in the top workpiece surface without engaging the top workpiece surface with structure of the apparatus applying external compressive forces to said workpiece and for separating said workpiece into a first workpiece portion having a first workpiece portion top surface and a planar first workpiece portion bottom surface and a second workpiece portion having a second workpiece portion top surface and a planar second workpiece portion bottom surface along said scribe line, said apparatus comprising, in combination:

a first vacuum chuck having a planar, upwardly directed first workpiece support surface for positively supporting said first workpiece portion over substantially the entire area of said planar first workpiece portion bottom surface, with the planar first workpiece portion bottom surface facing said planar, upwardly directed first workpiece support surface, and said first vacuum chuck applying a vacuum at the planar first workpiece portion bottom surface to maintain said first workpiece portion connected thereto and immovable relative thereto;

a second vacuum chuck adjacent to and pivotally connected to said first vacuum chuck and having a planar, upwardly directed second workpiece support surface for positively supporting said second workpiece portion over substantially the entire area of said planar second workpiece portion bottom surface, with the planar second workpiece bottom surface facing said planar, upwardly directed second workpiece support surface, and said second vacuum chuck applying a vacuum at the planar second workpiece portion bottom surface to maintain said second workpiece portion connected thereto, said first and second vacuum chucks including facing side walls having straight top edges meeting along a straight pivot line; and vacuum chuck mover structure for causing pivotal movement of one of said first and second vacuum chucks downwardly relative to the other of said first and second vacuum chucks about said pivot line while the straight top edges meet to exert bending forces on the workpiece supported thereby while said first workpiece portion remains positively supported by and connected to said first workpiece support surface due to application of vacuum by said first vacuum chuck without engaging the first workpiece portion with structure of the apparatus applying external compressive forces to said first workpiece portion top surface and while said second workpiece portion remains positively supported by and connected to said second workpiece support surface due to application of vacuum by said second vacuum chuck without engaging the second workpiece portion with structure of the apparatus applying external compressive forces to said second workpiece portion top surface to break the workpiece along the scribe line formed therein, said first and second workpiece support surfaces and said pivot line lying in a common plane prior to said pivotal movement of one of said first and second vacuum chucks to exert bending forces on the workpiece, and said pivot line disposed adjacent to and in alignment with said scribe line.

2. The apparatus according to claim 1 wherein said vacuum chuck mover structure is connected to said second vacuum chuck to pivot said second vacuum chuck about said pivot line while said first vacuum chuck is immobile.

3. The apparatus according to claim 2 wherein said vacuum chuck mover structure includes a motor and linkage interconnecting said motor and said second vacuum chuck.

4. The apparatus according to claim 1 wherein said facing side walls extend downwardly from said pivot line, said facing side walls diverging from one another in a downward direction when said first workpiece support surface and said second workpiece support surface are co-planar.

5. The apparatus according to claim 4 wherein the facing side wall of said second vacuum chuck defines an acute angle with said second workpiece support surface.

6. The apparatus according to claim 4 wherein each of said first and second vacuum chucks includes a chuck plate forming one of said facing side walls defining a cavity closely adjacent to the facing side wall thereof and extending downwardly from the workpiece support surface thereof and a porous member in said cavity for placement in communication with a vacuum source and for applying a vacuum to the bottom of said workpiece.

7. The apparatus according to claim 6 wherein said porous member is formed of porous ceramic material and has an upper porous member surface comprising a portion of a workpiece support surface.

8. The apparatus according to claim 1 wherein said first workpiece support surface and said second workpiece support surface define an obtuse angle while said first vacuum chuck and said second vacuum chuck exert bending forces on said workpiece.

9. The apparatus according to claim 1 additionally comprising workpiece transport structure for selectively transporting the workpiece relative to said first vacuum chuck and said second vacuum chuck.

10. The apparatus according to claim 9 wherein said workpiece transport structure includes a mounting frame employed to position the workpiece over the first vacuum chuck and over the second vacuum chuck, mounting frame moving structure for selectively moving said mounting frame and a support sheet stretched across said mounting frame, said workpiece disposed on and secured to said support sheet.

11. The apparatus according to claim 10 wherein said mounting frame moving structure includes at least one frame movement stage for selectively rotating said mounting frame and for selectively linearly moving said mounting frame.

12. The apparatus according to claim 10 wherein said mounting frame moving structure includes a plurality of frame movement stages, each of said frame movement stages including a linear motor, the linear motors of each frame movement stage being independently operable.

13. The apparatus according to claim 1 additionally comprising a scribe line alignment stage for scanning the workpiece to check alignment of the scribe line.

* * * * *